(12) United States Patent
McPherson (10) Patent No.: US 7,628,021 B2
(45) Date of Patent: Dec. 8, 2009

(54) SOLID STATE HEAT PUMP

(75) Inventor: Joe Wayne McPherson, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 402 days.

(21) Appl. No.: 11/450,400

(22) Filed: Jun. 12, 2006

(65) Prior Publication Data

US 2007/0283994 A1    Dec. 13, 2007

(51) Int. Cl.
    *F25B 21/00*    (2006.01)
    *H01L 35/00*    (2006.01)
(52) U.S. Cl. .......................... 62/3.1; 136/200
(58) Field of Classification Search ............ 62/3.1; 136/200
    See application file for complete search history.

(56) References Cited

U.S. PATENT DOCUMENTS

| | | | | |
|---|---|---|---|---|
| 3,833,428 A | * | 9/1974 | Snyder et al. | 136/202 |
| 3,890,161 A | * | 6/1975 | Brown, III | 136/212 |
| 4,004,210 A | * | 1/1977 | Yater | 322/2 R |
| 4,019,113 A | * | 4/1977 | Hartman | 322/2 R |
| 5,256,469 A | * | 10/1993 | Cherukuri et al. | 428/210 |
| 5,356,484 A | * | 10/1994 | Yater et al. | 136/200 |
| 5,376,587 A | * | 12/1994 | Buchmann et al. | 438/122 |
| 5,699,668 A | * | 12/1997 | Cox | 62/3.1 |
| 5,722,242 A | * | 3/1998 | Edelson | 62/3.1 |

OTHER PUBLICATIONS

J. W. McPherson, "Determination of the nature of molecular bonding in silica from time-dependent dielectric breakdown data," Journal of Applied Physics, vol. 95, No. 12, Jun. 15, 2004, pp. 8101-8109.
J. W. McPherson, "Extended Mie-Grüneisen molecular model for time dependent dielectric breakdown in silica detailing the critical roles of O-Si=$O_3$ tetragonal bonding, stretched bonds, hole capture, and hydrogen release," Journal of Applied Physics 99, 083501 (2006), pp. 83501-1 to 83501-13.

* cited by examiner

*Primary Examiner*—William C Doerrler
(74) *Attorney, Agent, or Firm*—Warren L. Franz; Wade J. Brady, III; Frederick J. Telecky, Jr.

(57) ABSTRACT

In accordance with the invention, there are methods for transferring heat, for heating and cooling, and there is a solid state heat pump. The solid state heat pump can include a power supply that provides an electric field, a first metal layer, a dielectric layer disposed over the first metal layer, wherein the dielectric layer absorbs a first amount of heat upon application of the electric field and releases a second amount of heat upon alteration of the electric field, and wherein the second amount of heat is greater than the first amount of heat, and a second metal layer disposed over the dielectric layer. The alteration of the electric field can be achieved at least by one of reducing, removing, and/or reversing the polarity of the electric field. The solid state heat pump can also include a series resistor.

20 Claims, 5 Drawing Sheets

SOLID STATE HEAT PUMP

DESCRIPTION OF THE INVENTION

1. Field of the Invention

The subject matter of this invention relates to heat pumps. More particularly, the subject matter of this invention relates to solid state heat pumps.

2. Background of the Invention

Conventional heating and refrigeration systems employ heat pumps relying on the principle of gas compression, phase change, thermoelectric, geothermal, or vortex. Each of these heat pumps has its own strengths and weaknesses. Most common refrigeration systems use gas compression and phase change heat pumps that utilize chloro-fluoro carbon molecules (CFC) which are environmentally disfavored. Thermoelectric heat pumps are commonly used in semiconductor devices to cool large scale integrated circuits. Geothermal heat pumps are highly efficient, but the high initial cost of installation deters people from using them. Vortex heat pumps are powered by compressed gas and are highly reliable, but are less efficient compared to others. Thus, there is a need for an energy efficient heating and refrigerant system employing no liquids or compressors.

Accordingly, there is a need to overcome these and other problems of the prior art to provide a solid state heat pump that reduces the high energy cost associated with the prior art heating and refrigeration systems.

SUMMARY OF THE INVENTION

In accordance with the invention, there is a solid state heat pump. The solid state heat pump can include a power supply that provides an electric field, a first metal layer, a dielectric layer disposed over the first metal layer, wherein the dielectric layer absorbs a first amount of heat upon application of the electric field and releases a second amount of heat upon alteration of the electric field, and wherein the second amount of heat is greater than the first amount of heat, and a second metal layer disposed over the dielectric layer. The alteration of the electric field can be accomplished at least by one of reducing, removing, and/or reversing the polarity of the electric field. The solid state heat pump can also include a series resistor.

According to another embodiment of the invention, there is a method of heating or cooling. The method of heating or cooling can include providing a solid state heat pump wherein the solid state heat pump includes a first metal layer, a dielectric layer over the first metal layer, a second metal layer over the dielectric layer, and a power supply. The method can also include applying a voltage so that the dielectric layer of the solid state heat pump absorbs heat from a heat source, whereby cooling the heat source. The method can also include at least one of reducing, removing, and/or reversing the polarity of the voltage, so that the dielectric layer of the solid state heat pump releases heat to a heat sink, whereby heating the heat sink, and wherein the heat released is greater than the heat absorbed. The method can also include providing a series resistor to the solid state heat pump.

According to yet another embodiment of the present invention, there is a method for transferring heat energy between two different temperatures. The method can include providing a heat source having a first temperature and a heat sink having a second temperature. The method can further include providing a solid state heat pump, wherein the solid state heat pump includes a capacitor and a power supply, wherein the capacitor includes a first conductive layer, a dielectric layer disposed over the first conductive layer, and a second conductive layer over the dielectric layer. The method can also include applying a voltage from the power supply to the capacitor whereby heat is absorbed by the capacitor from the heat source having a first temperature. The method can further include at least one of reducing, removing, and/or reversing the polarity of the voltage whereby heat is released by the capacitor to the heat sink having a second temperature, wherein the second temperature is greater than the first temperature. The method can also include providing a series resistor to the solid state heat pump.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIG. 2 also schematically illustrates the impact of electric field on bonding in silica.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

Figure 2:
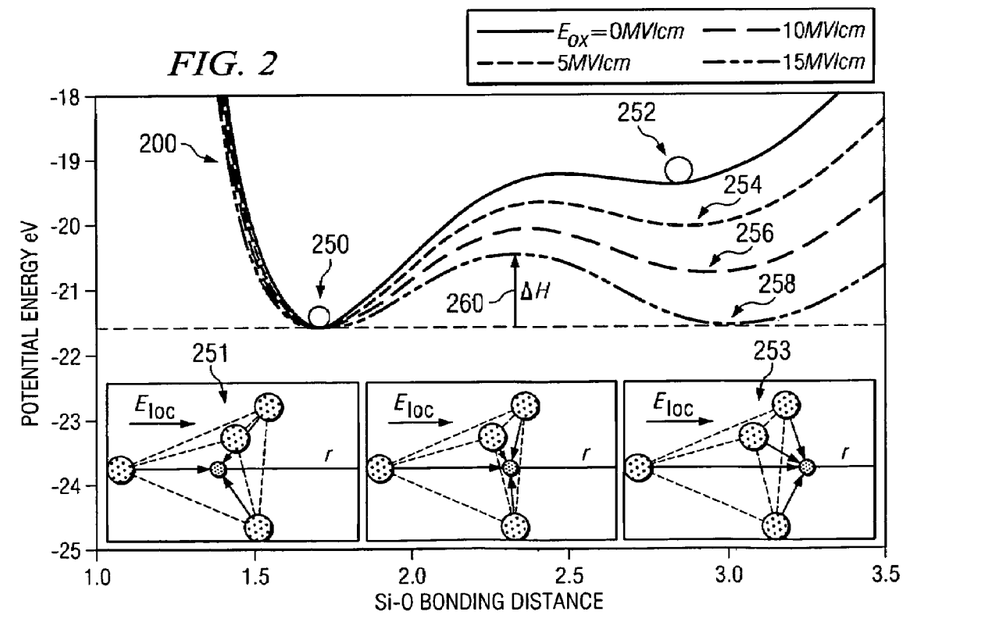
FIG. 2 is a graph plotting potential energy versus Si—O bonding distance at various applied electric field.

As used herein, the terms "molecular flipping" and "molecular switching" can refer to, for example as shown in FIG. 2, a phase change in a solid such as the silicon-ions in silica transition from their normal fourfold-bonded configuration 251 to a threefold-bonded configuration 253 under the application of voltage. This represents a molecular phase change from one state to another, e.g., from a ground state (primary state) to an excited state (secondary state) and vice versa. Molecular flipping can occur in other polar dielectric materials besides silica.

Figure 1:
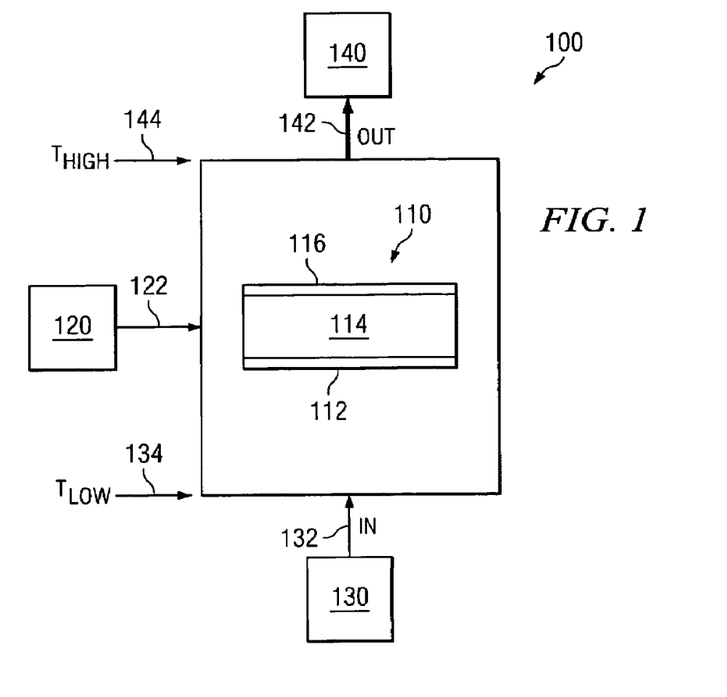
FIG. 1 illustrates an exemplary solid state heat pump in accordance with the present teachings.

In accordance with various embodiments, FIG. 1 illustrates an exemplary solid state heat pump 100. As shown in FIG. 1, the solid state heat pump 100 can include a capacitor 110 and a power supply 120 as a voltage source. The capacitor 110 can include a first conductive layer 112, a dielectric layer 114 disposed over the first conductive layer, and a second conductive layer 116 disposed over the dielectric layer 114. The power supply 120 provides an electric field in the dielectric layer 114 of the capacitor 110, wherein the dielectric layer 114 absorbs a first amount of heat 132 upon application of the electric field and releases a second amount of heat 142 upon alteration of the electric field, and wherein the second amount of heat 142 is greater than the first amount of heat 132. The alteration of the electric field can be achieved at least by one of reducing, removing, and/or reversing the polarity of the electric field. According to various embodiments, the conductive layers 112 and 116 can be formed of a metal, such as, for example, aluminum.

When a voltage is applied to the capacitor 110, an amount of work 122 (work=½ $CV^2$, where C is the capacitance and V is the voltage) is done in charging the capacitor 110. The charging of the capacitor 110 can result in a heat flow from the heat source 130 into the capacitor 110 to activate molecular switching, depicted as arrow 132 in FIG. 1, to bring about the molecular phase change in the dielectric layer 114 from the ground to the excited state. When the capacitor 110 is discharged, a large amount of heat, depicted as arrow 142 in FIG. 1, can flow out to the heat sink 140 as a result of the molecules returning to the ground state. As a result of the work 122 done on the capacitor 110, depicted as arrow 122 in FIG. 1, and also a heat flow 132 into the capacitor from the low temperature T1 reservoir 130 to activate the phase change in the dielectric layer 114, a larger heat flow 142 out to the high temperature $T_{High}$ reservoir 140 can be expected when the voltage applied to the capacitor 110 is either reduced, removed or the voltage polarity is reversed. A new heating cycle for the heat pump starts with the reapplication of the voltage to the capacitor 110 plus the heat flow 132 into the capacitor 110.

The heat source 130 can be an environment such as gas, liquid, or solid such that it is capable of delivering a heat flow 132 into the capacitor 110 charged by the application of voltage. The heat sink 140 can also be an environment such as gas, liquid, or solid such that it is capable of absorbing the heat flow 142 out when the charged capacitor 110 is discharged by removal of the voltage. During the charging of the capacitor 110, the capacitor 110 can be thermally isolated from the high temperature reservoir 140, but the capacitor 110 can be exposed to the low temperature heat reservoir 130 from which it can receive heat 132 to activate the material phase change during this part of the cycle. During the discharging of the capacitor 110, the capacitor 110 can be thermally isolated from the low temperature reservoir 130, but the capacitor 110 can be exposed to the high temperature heat reservoir 140 to which the heat 142 can be released during this part of the cycle. Thus during a complete cycle, heat 132 can be absorbed from the low temperature heat reservoir 130 during capacitor 110 charging (work) and then the work 122 and heat 132 can be released as heat 142 to the high temperature reservoir 140. After the discharging of the capacitor 110, the heat 142 can flow out, the heat reservoir 140 can be again thermally isolated from the capacitor 110, and the capacitor 110 can then be charged and the heat 132 can flow from the low temperature reservoir 130 to the capacitor 110, and accordingly the full heat-pump cycle can be completed.

In some embodiments, wherein the solid state heat pump 100 can be used as a heating unit to heat, for example, the inside of a building, the heat source 130 can be the outside of the building and heat sink 140 can be in the inside of the building. In other embodiments wherein the solid state heat pump 100 can be used as a refrigerator (or air conditioner), the heat source 130 can be the inside of the refrigerator and heat sink 140 can be the outside of the refrigerator. Depending upon the application, one of ordinary skill in the art would know that any object or environment that needed to be cooled can be used as a heat source 130 and any object or environment that needed to be heated can be used as a heat sink 140.

According to various embodiments, the disclosed solid state heat pumps can rely on the molecular flipping in the dielectrics (a solid-state phase change) under the action of a strong electric field. FIG. 2 illustrates the basic principle of operation of an exemplary solid state heat pump relying on the molecular flipping. More specifically, FIG. 2 shows the impact of electric field on bonding and activation energy in the case of silica using a Mie-Gruneisen (M-G) molecular model. The Mie-Gruneisen (M-G) molecular bonding potential, as disclosed for example in J. W. McPherson, J. Appl. Physics, 2004, 95, 8101, has been used to describe Si—O bonding and the bond breakage process in silica. The M-G model has also been successful in describing the field acceleration parameter associated with time dependent dielectric breakdown (TDDB) testing. Time dependent dielectric breakdown (TDDB) is a common technique used to evaluate reliability of gate oxides in MOS devices. In TDDB tests, either the time needed to break an oxide stressed with high voltage is measured (CVS—Constant Voltage Stress), or the time of current injection into the oxide after which the oxide fails (CCS—Constant Current Stress) is measured.

A more generalized extended M-G model, as disclosed in J. W. McPherson, J. Appl. Phys., 2006, 99, 083501, which is incorporated by reference herein in its entirety, can be used to understand the roles of both field and current and their effect on the activation energy observed during TDDB testing. The more generalized extended M-G molecular model addresses the polar nature of the Si—O bond (from coulomb interactions) and the covalent nature of the Si—O bond (purely from the quantum mechanical effects) for the O—Si≡$O_3$ and other tetrahedrally bonded materials. In fact, the more generalized extended M-G model can be used to describe the molecular bonding in all polar dielectrics and it explains that the dipole flipping under high electric fields is not restricted just to silica based dielectrics. Therefore in various embodiments, the solid-state heat pump 100 can comprise any polar linear or non-linear dielectric material which can undergo dipole flipping (solid-state phase change) under the application of applied voltage.

Figure 3:
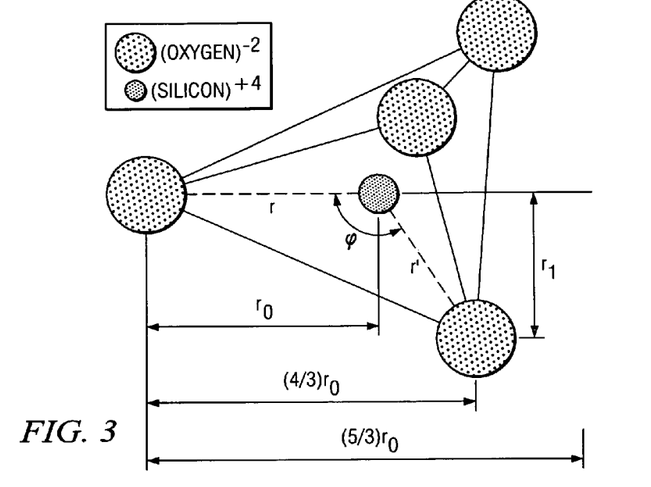
FIG. 3 is a schematic illustration of a fundamental tetrahedral structure of an amorphous silica molecule with approximate equilibrium bonding geometries.
Figure 4A:
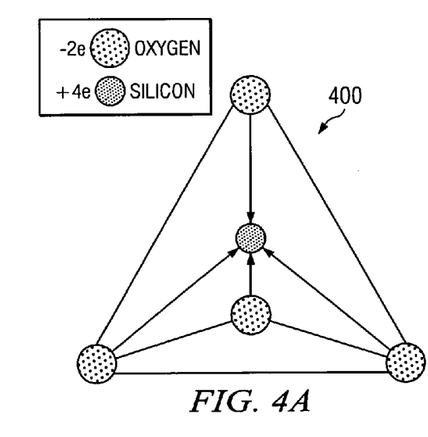
FIG. 4A illustrates a normal tetrahedral/dipolar configuration in silica.
Figure 4B:
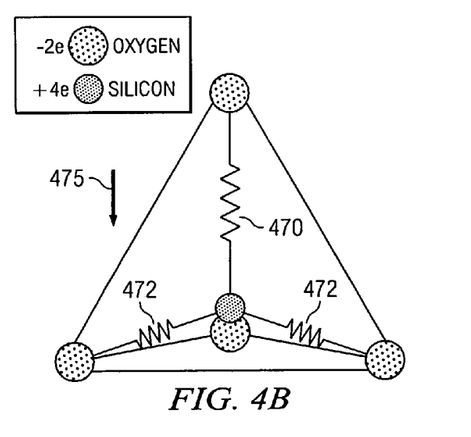
FIG. 4B illustrates bond distortion in silica by electric field.

FIG. 3 shows a fundamental tetrahedral structure of amorphous silica with approximate equilibrium bonding geometries. An ideal amorphous silica network is composed of O—Si≡O$_3$ tetrahedral joined at the corners by somewhat flexible Si—O—Si bonds thus permitting the formation of a rather dense solid network. Silica is a linear dielectric and therefore any dielectric polarization must be induced by an external electric field. Once the external field is applied, a local electric field develops which serves to produce an alternating series of tensile (stretching) and compressive (shortening) of neighboring Si—O bonds. FIG. 4B shows Si—O bond distortion by an electric field in silica. In comparison, FIG. 4A shows normal tetragonal/dipolar arrangement of Si—O bonds of silica 400. In FIG. 4B, a top Si—O bond 470 is stretched while three complimentary bonds 472 below are compressed. A local electric field E$_{loc}$ 475, which stretches/compresses the Si—O bonds in silica is produced by a combination of the external field E$_{ox}$ in the dielectric plus the surrounding induced dipolar field. This local electric field 475 is usually called the Mossotti field and it is described by the Lorentz relation:

$$E_{loc} = \left(\frac{2+k}{3}\right)E_{ox} \quad (1)$$

where k is the dielectric constant and E$_{ox}$ is the externally produced field in the dielectric (E$_{ox}$=(applied voltage)/(dielectric thickness)).

Referring back to FIG. 2, the potential energy curves 200 have a strong energy minimum 250 at r=r$_0$ (where r is the Si—O bond distance and r$_0$ is the mean equilibrium Si—O bond distance in the normal tetrahedral bonding geometry) for the Si-ion of the silica tetrahedron 251 to remain in its normal fourfold coordination without any field. However, when a field is applied, the dipolar interaction with the field causes a secondary energy minimum 252 to be formed at about r=(5/3)r$_0$. As the field is increased to 10 MV/cm, it becomes increasingly more energetically favorable for the Si-ion of the silica tetrahedron 253 to sit on the flip side of the plane (threefold coordination) containing the three neighboring oxygen atoms as shown by a secondary minimum at 256. As the field is further increased to about 15 MV/cm, this secondary saddle point eventually reaches energy equivalence at 258 with the first minimum 250. Also, as shown in FIG. 2, the dipolar field interaction serves to lower an activation energy 260 needed for molecular flipping, from its nominal 2 eV value to a value lower than 1 eV. Furthermore, hole capture while in this stretched state can further lower this activation energy and can greatly impact the flipping (bond-breakage) rate.

The more generalized extended M-G molecular model can be used to explain the bond breakage mechanism in amorphous silica. While not intending to be bound by any specific theory, it is believed that upon creation of a very high local electric field, the Si—O bond is severely stretched. The stretched Si—O bond can be broken by a relaxation process whereby the Si-ion flips from a fourfold coordination at r=r$_0$ to a three fold coordination at r=(5/3)r$_0$. When the Si-ion flips, the associated dipole moments also flip so as to be properly aligned with the electric field. Thus, this relaxation process can be seen as being driven by a dipolar-energy reduction with flipping. Since the dipolar energy reduction due to flipping (at 15 MV/cm) is around 2 eV, then in the flipped configuration, the secondary saddle point becomes approximately equivalent to the first. If the activation energy for flipping is ΔH<1 eV, and it becomes lower with hole capture, then at least 50% of the stretched bonds are expected to flip rapidly at around 15 MV/cm, with each flipping event causing the breaking of a Si—O bond. This dipole flipping/bond breakage can continue until a localized conductive percolation path of broken bonds can be created thus causing a localized current surge, severe joule heating, and a permanent conductive filament to form. Thus, amorphous silica films can show very rapid dielectric degradation and breakdown at about 15 MV/cm. One of ordinary skill in the art will understand that other polar dielectric materials can also exhibit dipole flipping under high local electric fields and thus can be used in a solid state heat pump.

Figure 7:
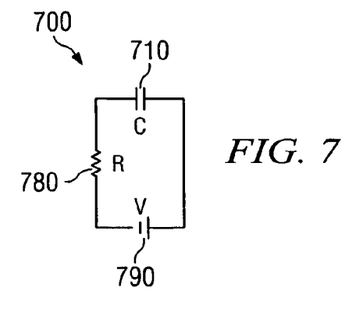
FIG. 7 illustrates another exemplary solid state heat pump in accordance with the present teachings.

In various embodiments, if a dielectric material is chosen such that it is not very sensitive to TDDB (time dependent dielectric breakdown), or if a series resistor is added to the capacitor as shown in FIG. 7 to limit the high current which is normally required for hard breakdown of the capacitor dielectric, then according to FIG. 2 and the more generalized extended M-G molecular model, a solid state heat pump and/or a solid state refrigerator can be fabricated. In FIG. 2, the energy minimum 250 at r=r$_0$ will be referred to as primary (or ground) state and the minimum 258 at r=(5/3)r$_0$ will be referred to as the secondary (or excited) state.

In various embodiments, upon application of a strong electric field, the dielectric will absorb energy from the ambient so that dipoles can be activated/flipped from the primary state to the now approximately energy equivalent secondary state. The rate of molecular flipping will depend on the activation energy ΔH 260. However, as shown in FIG. 2, the activation energy 260 can be easily field modulated. The molecular transition rate can be calculated using half life of a reaction t$_{1/2}$ given by:

$$t_{1/2} = \frac{\ln(2)}{k} \quad (2)$$

where k is the reaction rate constant and is given by:

$$k = v_0 \exp\left[-\frac{\Delta H}{K_B T}\right] \quad (3)$$

where v$_0$ is the molecular vibrational frequency, and is ~10$^{13}$/sec and ΔH is the activation energy. At room temperature (T=300° K) and with the activation energy for flipping, ΔH=1.0 eV, t$_{1/2}$≅1.2 hour and with ΔH=0.5 eV, t$_{1/2}$≅17 μsec. Therefore with ΔH of 0.75 eV, the pumping rates can be as fast as 1 second or less. Thus, upon application of electric field, heat energy can be absorbed from the ambient and can be used to pump the molecules from the primary state 250 to the secondary state 258.

Upon reduction or removal of electric field, the molecules in the pumped secondary state 258 will spontaneously return to the primary state 250 or can be stimulated to return by reversing the voltage polarity. The spontaneous transition from the secondary 258 to the primary state 250 occurs because the primary state 250 is 2 eV lower in energy at zero field. This energy release of around 2 eV per flipped molecule is very large. The energy release serves to heat the dielectric and produce a rapid rise in the dielectric temperature.

In accordance with other embodiments of the invention, the molecules in the pumped secondary state 258 can be stimulated to rapidly return to the primary state 250 by reversing the polarity of the electric field. With all the molecules in the secondary state 258 flipping back to the primary state 250 at the same time, an even greater rise in temperature can be achieved.

Figure 5:
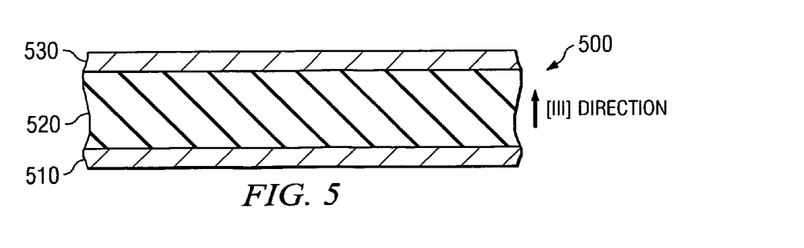
FIG. 5 is a schematic illustration of a metallized capacitor with cristobalite, a polymorph of quartz, as the dielectric layer along a preferred direction and metal layers on the top and bottom surface of the cristobalite in accordance with the present teachings.

FIG. 5 shows a metallized capacitor 500 utilizing a dielectric layer of cristobalite 520, a polymorph of quartz. This particular crystalline phase of silica was chosen only as one example of a polar dielectric material that is expected to be more resistant to TDDB effects during heat pump operation. Other polar dielectric material resistant to TDDB can be used or a series resistor 780 can be added to the capacitor 710 to minimize TDDB effects. Other polar dielectrics that can be used in the solid state heat pump include at least one of oxides, nitrides and oxynitrides of Si, Al, B, Be, Ti, W, Ta, Zr, Hf, Y, Sc, Ac, Th, U, Pr, La, Ge, Sn, Mg, Ca, Ba, V, Nb, Cr, Mo, Mn, Tc, Re, Fe, Ru, Os, Co, Rh, Ir, Ni, Pd, Pt, Cu, Ag, Au, Zn, Cd, Hg, Ga, In, Tl, Ce, Pr, Nd, Pm, Sm, Eu, Gd, Tb, Dy, Ho, Er, Tm, Yb, Lu, and Pa, and salts of Li, Na, K, Rb, Cs, Be, Mg, Ca, Sr, Ba, Ra, and Fr.

In FIG. 5, the metallized capacitor 500 includes a first metal layer 510, a dielectric layer of cristobalite 520 over the first metal layer 510, and a second metal layer 530 over the dielectric layer of cristobalite 520. In certain embodiments, a wafer of crystalline dielectric can be used. According to various embodiments, the dielectric layer 114 and also the layer of cristobalite 520 can have any thickness $t_{dielectric}$ that is compatible with the available power supply voltage V. For example, the local electric field in the dielectric is given by:

$$E_{Local} = \left(\frac{2+k}{3}\right) E_{dielectric} = \left(\frac{2+k}{3}\right)\left(\frac{V}{t_{dielectric}}\right) \quad (4)$$

where $E_{dielectric}=(V/t_{dielectric})$ is the external field produced when the voltage V is applied. Since, generally rapid dipole flipping occurs for $E_{Local}\sim 30$ MV/cm, then for arbitrary applied voltage V and arbitrary dielectric of dielectric constant k, the required dielectric thickness for heat pump operation can be easily determined.

Metallization can be added to the top and bottom surface, of the dielectric layer 114. The type of metal and the thickness of the metal is relatively unimportant for heat pump operation. However, metals which have good corrosion-resistance such as aluminum, copper, aluminum-alloys, copper alloys can be used. Also, higher melting point metals such as the refractory metals, their silicides and nitrides can be used for metallization. In certain embodiments of the invention the metal layers 112 and 116 can have a practical thickness from about 0.01 μm to about 1000 μm, and in some cases from about 0.5 μm to about 1 μm and in other cases from about 0.05 μm to about 0.5 μm.

According to various embodiments, the thickness of the dielectric layer 114 and the capacitor 110 area can be chosen depending upon the desired amount of heat delivery 142 from the heat pump for the available power supply voltage. A thinner dielectric layer 114 can lower the operating voltage that can be applied for molecular flipping, but a smaller amount of heat 142 can be released simply because fewer dipoles are available for flipping. In applications requiring greater heat 142 delivery from the heat pump, a thicker dielectric layer 114 can be used, which in turn would require a correspondingly higher operating voltage to achieve molecular flipping and thus more work 122 would be required from the power supply to charge the capacitor 110.

Figure 8:
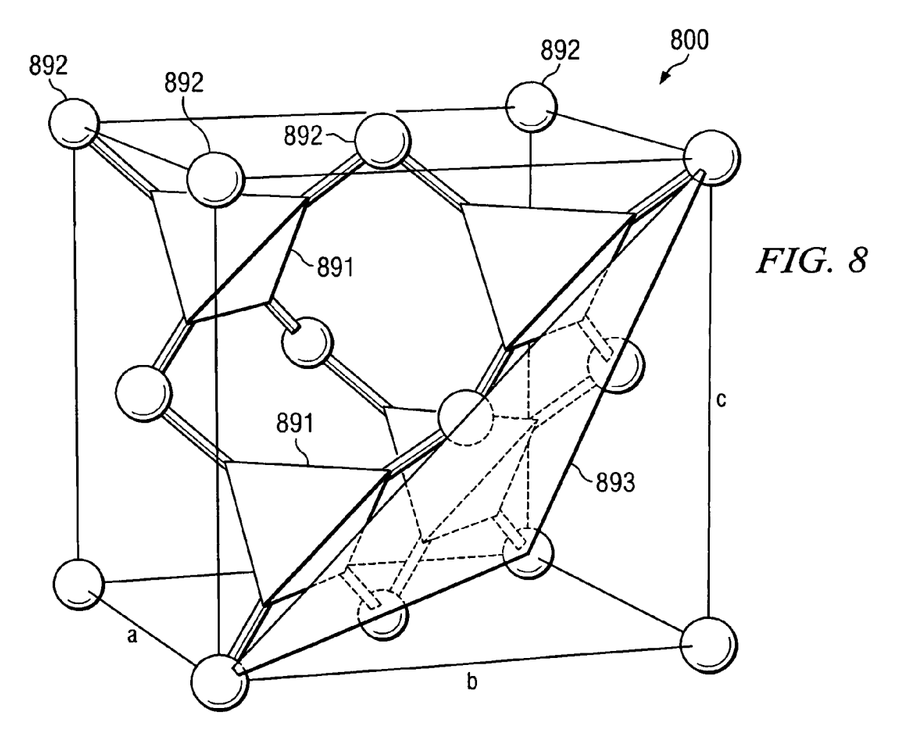
FIG. 8 is a schematic illustration of a cristobalite unit cell with four silicon atoms tetrahedrally bonded to neighboring oxygen atoms.

Referring back to FIG. 2, an electric field can be applied such that the energy level for the secondary state becomes less than or equal to that of the primary state. Under these high electric field conditions, the activation energy for flipping between the primary state and the secondary state is generally 1 eV or less such that the molecules will rather quickly, in about seconds, absorb energy from the surroundings to activate the flip. For example, cristobalite with a (111) direction 893 as shown in FIG. 8, parallel to the intended external field direction can be used for the crystalline dielectric. The single crystal cristobalite (111) can be used because the broken bonds produced by molecular flipping (p-type orbitals) are highly directional. Hence, these highly directional broken bonds are expected to produce minimal wave function overlap so as to minimize TDDB effects under high field. Thus, to minimize TDDB effects, crystalline polar dielectrics seem to be the dielectrics of choice for the heat pump.

Once the molecules in the charged dielectric layer 114 are in the pumped state, by absorbing heat from the surroundings to actuate the dipolar flip, the electric field can be reduced, eliminated or reversed to cause the excited molecules in the dielectric to return to the ground state. At zero field, the pumped molecules can spontaneously return to the ground state giving up 2 eV of energy per flipped molecule.

Figure 6A:
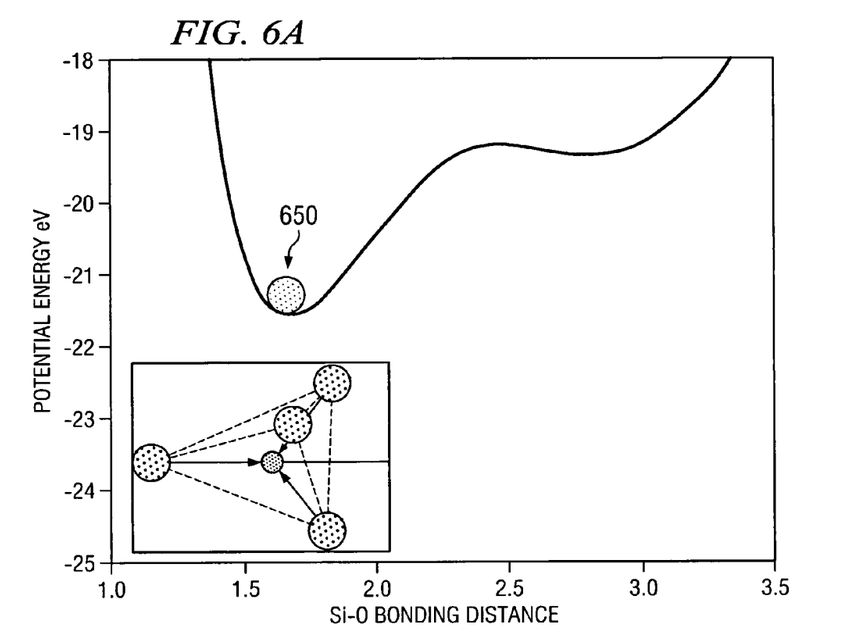
FIGS. 6A-6D are schematic illustrations of potential energy curves of a metallized quartz solid state heat pump during pumping to excited state and returning to ground state.
Figure 6B:
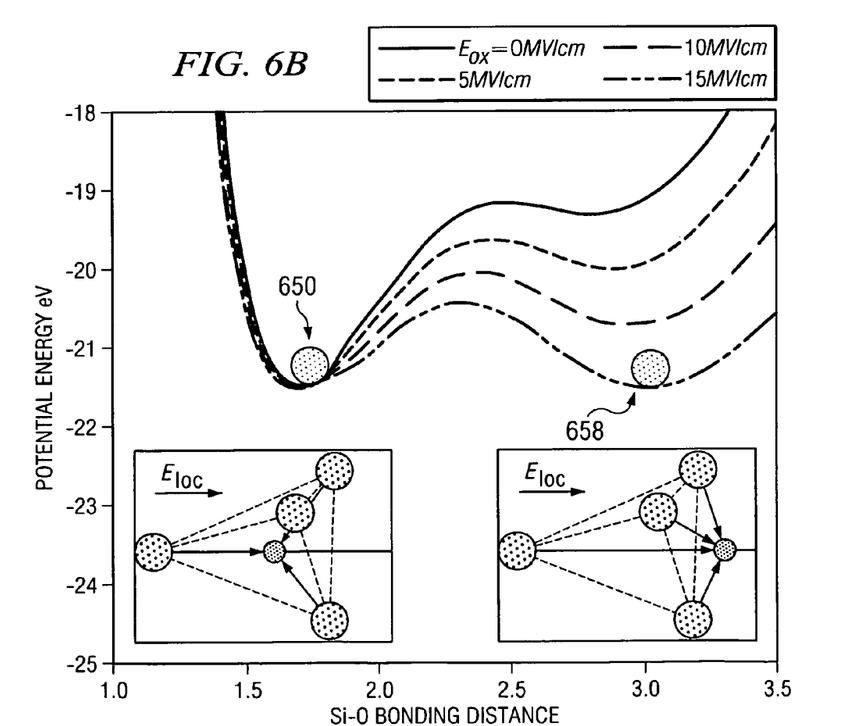
Figure 6C:
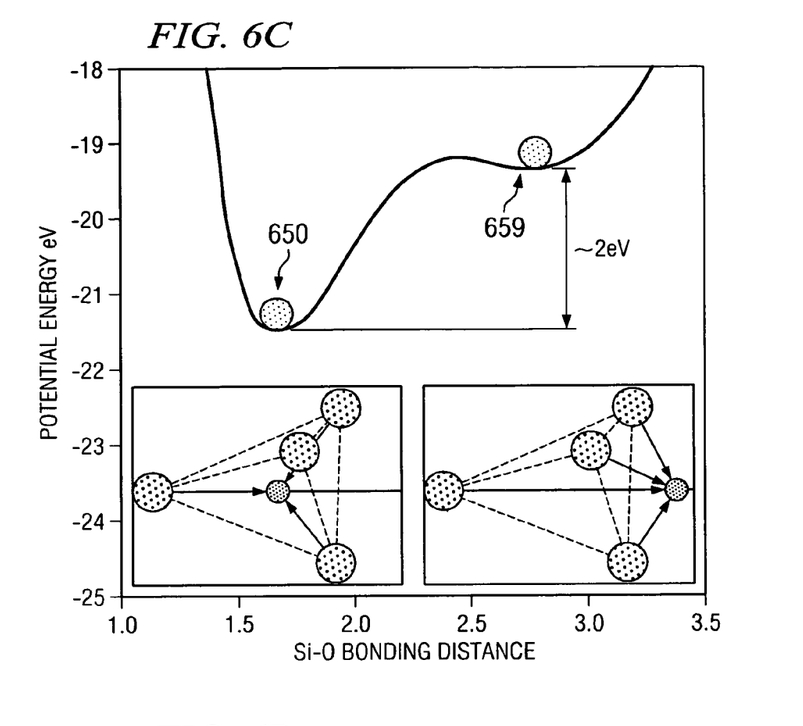
Figure 6D:
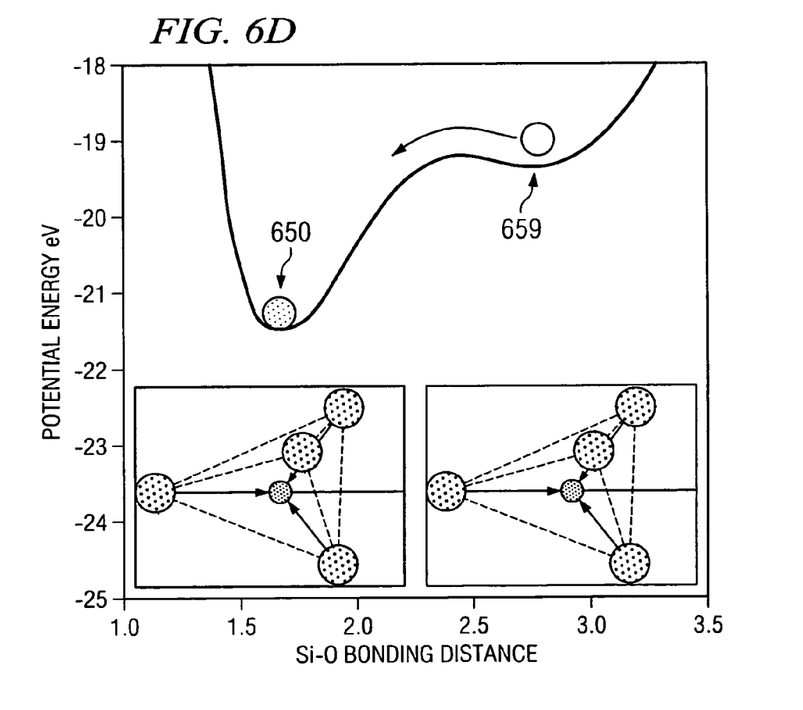

FIGS. 6A-6D are schematic illustrations of potential energy curves of a metalized quartz solid state heat pump during pumping to excited state and returning to ground state. FIG. 6A shows that, in the absence of electric field, all the molecules are in a ground state 650. Upon application of electric field, approximately half of the molecules can get pumped from the ground state 650 to an excited state 658 as shown in FIG. 6B. Heat is absorbed from ambient to activate this process of molecular transition. FIG. 6C further shows that upon removal of electric field, the pumped molecules in an excited state 659 have approximately 2 eV of energy higher than the ground state 650, and virtually there is no activation barrier for the molecules to return from the excited state 659 to the ground state 650. Furthermore, FIG. 6D illustrates that upon removal of electric field, the molecules rapidly return to the ground state with the release of energy of about 2 eV per flipped molecule and this results in an increase in temperature of the dielectric.

According to various embodiments, rapid stimulated emission of heat can also be achieved by simply reversing the polarity of the electric field. For example, a quartz wafer under rapid spontaneous or stimulated emission of heat could easily reach approximately 1600° C. and therefore can be used to form a solid state heat pump.

The total energy $U_{PS}$ required from the power supply, of constant voltage V, to cause a charge Q to form on the first metal layer 510 and the second metal layer 530 over the dielectric layer of cristobalite 520 of the capacitor 500 is given by:

$$U_{PS} = QV = (\sigma A)V \quad (5)$$

where σ is the charge per unit area on the first metal layer 510 and the second metal layer 530 of the capacitor 500 of area A. This gives an energy density of $$\tilde{U}^o_{PS} = \frac{QV}{V_{vol}} = \frac{\sigma A V}{A t_{diel}} = \sigma\left(\frac{V}{t_{diel}}\right) = \sigma E \quad (6)$$

where $V_{vol}$ is the volume of the dielectric layer of cristobalite 520, $t_{diel}$ is the thickness of the dielectric layer of cristobalite 520, and E is the electric field. The energy $U_{cap}$ stored in the capacitor 500 is given by:

$$U_{cap} = \frac{1}{2}CV^2 = \frac{1}{2}(CV)V = \frac{1}{2}QV \qquad (7)$$

where C is the capacitance of the capacitor 500 and V is the voltage across the dielectric 520. Thus giving an energy density $\tilde{U}_{cap}$ for the capacitor 500 as:

$$\tilde{U}_{cap} = \frac{1}{2}\frac{QV}{V_{vol}} = \frac{1}{2}\frac{\sigma AV}{At_{diel}} = \frac{1}{2}\sigma\left(\frac{V}{t_{diel}}\right) = \frac{1}{2}\sigma E \qquad (8)$$

One will note that the energy density $\tilde{U}_{cap}$ stored in the capacitor 500 is only one-half the energy density $\tilde{U}_{PS}$ supplied by the power supply 120. This occurs because one-half of the energy $\tilde{U}_{PS}$ supplied by the power supply 120 to the capacitor 500, goes into the Joule heating of the metal leads (or series resistance) which service the capacitor.

The total conduction charge per unit area $\sigma_{total}$ stored on the first metal layer 510 and the second metal layer 530 of the capacitor 500 can easily be calculated because it is the sum of the usual capacitor charge per unit area $\sigma_0$ plus the additional charge per unit area $\sigma_1$ induced when the dipoles flip. $\sigma_0$ on the first metal layer 510 and on the second metal layer 530 of the capacitor 500 at 15 MV/cm can be determined directly from the electric displacement D:

$$\sigma_0 = D \qquad (9)$$
$$= \varepsilon_0 k E$$
$$= \left(5.52 \times 10^{-3} \frac{e}{V\text{Å}}\right)(4.5)(15 \text{ MV/cm})\left(\frac{10^{-8} \text{ cm}}{1 \text{ Å}}\right)$$
$$= 0.0037 \frac{e}{(\text{Å})^2}.$$

where $\varepsilon_0 (= 5.52 \times 10^{-3}$ e/VÅ) is the permittivity of the vacuum, k (=4.5) is the dielectric constant of cristobalite 520, and E is the electric field in the capacitor 500.

However, in addition to this charge per unit area $\sigma_0$, an additional charge per unit area $\sigma_1$ is induced on the first metal layer 510 and the second metal layer 530 of the capacitor 500 when two of the four O—Si≡O₃ molecular dipoles (shown in FIG. 8) flip, thus causing an additional rise in dielectric polarization $\Delta P$:

$$\sigma_1 = \Delta D \qquad (10)$$
$$= \Delta P$$
$$= \frac{\sum_i \Delta p_i}{\text{Volume}}$$
$$= \frac{(7.14 + 7.14) \, e\text{Å}}{a \cdot b \cdot c}$$

-continued
$$= \frac{14.28 \, e\text{Å}}{170.95 \, (\text{Å})^3}$$
$$= 0.084 \, \frac{e}{(\text{Å})^2}$$

where the change of each dipole moment, $\Delta p_i = 7.14$ eÅ, was calculated, as disclosed in reference J. W. McPherson, J. Appl. Phys. 2006, 99, 083501. Therefore, the total energy density $\tilde{U}_{PS}$ required from the power supply 120 to charge the capacitor 500 to a field of 15 MV/cm plus when the dipoles flip is:

$$\tilde{U}_{PS} = \sigma_{Total} E \qquad (11)$$
$$= (\sigma_0 + \sigma_1) E$$
$$= (0.0037 + 0.084) \frac{e}{(\text{Å})^2} (15 \text{ MV/cm}) \left(\frac{10^{-8} \text{ cm}}{1 \text{ Å}}\right)$$
$$= 0.0132 \, \frac{\text{eV}}{(\text{Å})^3}$$

The heat release per unit volume, when two of the four O—Si≡O₃ molecular dipoles per unit volume (see FIG. 8) flip back when the field in the capacitor 500 is either removed, reduced, or reversed, is given by:

$$(\text{Heat})_{dipoles \, flip} = \frac{(2 \text{ dipole flips}) \cdot (2.4 \text{ eV/dipole flip})}{a \cdot b \cdot c} \qquad (12)$$
$$= \frac{4.8 \text{ eV}}{170.95 \, (\text{Å})^3}$$
$$= 0.0281 \, \frac{\text{eV}}{(\text{Å})^3}$$

The above equations now permit one to calculate the expected coefficient of performance (COP) for this solid state heat pump when the capacitor 500 is charged to a field of 15 MV/cm and then discharged:

$$COP = \frac{(\text{Heat})_{output}}{(\text{Work})_{input}} \qquad (13)$$
$$= \frac{(\text{Joule Heating})_{cap \, charging} + (\text{Joule Heating})_{cap \, discharging} + (\text{Heat})_{dipoles \, flip}}{(\text{Work})_{input}}$$
$$= \frac{\frac{1}{2}\sigma_{total}E + \frac{1}{2}\sigma_{total}E + (\text{Heat})_{dipoles \, flip}}{\sigma_{total}E}$$
$$= 1 + \frac{(\text{Heat})_{dipoles \, flip}}{\sigma_{total}E}$$
$$= 1 + \frac{0.0281 \, \frac{\text{eV}}{\text{Å}^3}}{0.0132 \, \frac{\text{eV}}{\text{Å}^3}}$$
$$= 3.12$$

Since standard resistive electric heater has a COP=1, this indicates that the solid-state heat-pump with the capacitor 500 should be at least 300% better than the standard resistive electric heater. Also, since energy must be conserved, $$(\text{Work})_{input} + (\text{Heat})_{input} = (\text{Heat})_{output} \quad (14)$$

this implies that the heat absorption 132 from the low temperature reservoir 130 to activate the phase change (flip the dipoles) in the dielectric layer of cristobalite 520 of the capacitor 500 is significant.

It is instructive to estimate how hot the dielectric layer of cristobalite 520 of the capacitor 500 could get when the voltage is removed and the excited molecules of the dielectric layer of cristobalite 520 return to the ground state. The maximum temperature rise during capacitor discharging occurs for a no heat loss condition. For such a condition, the maximum temperature rise ΔT in the dielectric layer of cristobalite 520 can be estimated as follows:

$$\Delta T = \frac{Q}{\rho \cdot c} \quad (15)$$

$$= \frac{2.81 \times 10^{-2} \frac{eV}{(\text{Å})^3}}{(2.33 \ gm/cm^3) \cdot (1 \ J/(gm - ^\circ K.)) \cdot \left(\frac{10^{-8} \ cm}{1 \ \text{Å}}\right)^3 \cdot \left(\frac{1 \ eV}{1.6 \times 10^{-19} \ J}\right)}$$

$$\cong 1900^\circ \ K.$$

$$\cong 1600^\circ \ C.$$

where Q is the heat release per unit volume, ρ is the density of quartz, and c is the specific heat of the quartz.

According to various embodiments of the present invention, a method of heating or cooling can include providing a solid state heat pump 100 wherein the solid state heat pump 100 includes a first metal layer 112, a dielectric layer 114 over the first metal layer 112, a second metal layer 116 over the dielectric layer 114, and a power supply 120 as a voltage source. The method can also include applying a voltage so that the dielectric layer 114 of the solid state heat pump 100 absorbs heat 132 from a heat source 130, whereby cooling the heat source 130. The dielectric layer 114 absorbs heat 132 from a low temperature reservoir 130 to flip molecules from their ground state 250 to one of the secondary excited states 252, 254, 256, 258. The method can also include at least one of reducing the voltage, removing the voltage, or reversing the voltage polarity to get the excited molecules from the secondary excited state to return to the ground state 250 thereby giving off a heat 142 to a high temperature reservoir 140, whereby heating the heat sink 140, and wherein the heat released 142 is greater than the heat 132 absorbed.

In certain embodiments of the present invention, the solid state heat pump 700 including a capacitor 710 can also include a series resistor 780 as shown in FIG. 7. A series resistor 780 can help prevent breakdown of the dielectric 114 of the capacitor 110 when it is operated at high fields. The series resistor 780 can limit the current surge which is needed to produce irreversible breakdown of the dielectric 114, thereby increasing the useful operational lifetime of the dielectric material.

According to various embodiments, a method for transferring heat energy between two different temperatures can include providing a heat source 130 having a first temperature 134 and a heat sink 140 having a second temperature 144. The method can include providing a solid state heat pump 100, wherein the solid state heat pump 100 includes a capacitor 110 and a power supply 120 as a voltage source, wherein the capacitor 110 includes a first conductive layer 112, a dielectric layer 114 disposed over the first conductive layer 112, and a second conductive layer 116 over the dielectric layer 114. The method can also include applying a voltage from the power supply 120 to the capacitor 110 whereby heat 132 is absorbed by the capacitor 110 from the heat source 130, and altering the voltage whereby heat 142 is released by the capacitor 110 to the heat sink 140. In certain embodiments, altering the voltage can be accompanied by at least one of reducing, removing, and/or reversing the polarity of the voltage.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A solid state heat pump comprising:
 a power supply that provides an electric field;
 a first metal layer;
 a layer of dielectric material disposed over the first metal layer; and
 a second metal layer disposed over the layer of dielectric material;
 the dielectric material being selected and the power supply being connected so that an electric field applied by the power supply across the first and second metal layers will reduce an energy level of a secondary energy state of the dielectric material to less than or equal to an energy level of a primary energy state of the dielectric material, whereby molecules of the dielectric material absorb activation energy in the form of heat from a heat source sufficient to become excited and flip from the primary energy state to the reduced energy level secondary energy state, thereby cooling the heat source; and so that when the electric field applied across the first and second metal layers is discontinued or its polarity reversed, the energy level of the secondary energy state will be reduced to cause the excited molecules of the dielectric material to return to the primary energy state, thereby releasing heat to a heat sink, thereby heating the heat sink; wherein the heat released to the heat sink will be greater than the heat absorbed from the heat source.

2. The solid state heat pump according to claim 1, wherein the dielectric layer is not sensitive to time dependent dielectric breakdown.

3. The solid state heat pump of claim 1, wherein the dielectric layer is formed of polar crystalline dielectric material so as to minimize the time-dependent dielectric breakdown.

4. The solid state heat pump of claim 1, wherein the dielectric material is formed of cristobalite.

5. The solid state heat pump of claim 1 further comprising a series resistor.

6. A method of heating or cooling comprising:
providing a solid state heat pump including a first metal layer, a layer of dielectric material over the first metal layer, and a second metal layer over the layer of dielectric material;
applying an electric field across the first and second metal layers to reduce an energy level of a secondary energy state of the dielectric material to less than or equal to an energy level of a primary energy state of the dielectric material, whereby molecules of the dielectric material absorb activation energy in the form of heat from a heat source sufficient to become excited and flip from the primary energy state to the reduced energy level secondary energy state, thereby cooling the heat source; and
altering the electric field applied across the first and second metal layers to raise the reduced energy level of the secondary energy state to cause the excited molecules of the dielectric material to return to the primary energy state, thereby releasing heat to a heat sink, thereby heating the heat sink; wherein the heat released to the heat sink is greater than the heat absorbed from the heat source.

7. The method of claim 6, wherein the dielectric layer is not sensitive to time dependent dielectric breakdown.

8. The method of claim 6, wherein the dielectric layer is formed of polar crystalline dielectric material so as to minimize the time-dependent dielectric breakdown.

9. The method of claim 6, wherein the dielectric layer is formed of cristobalite.

10. The method of claim 6, wherein the altering the voltage is accomplished by at least one of reducing, removing, and reversing the polarity of the voltage.

11. The method of claim 6, wherein the solid state heat pump further comprises a series resistor.

12. A method for transferring heat comprising:
providing a heat source having a first temperature and a heat sink having a second temperature;
providing a solid state heat pump, wherein the solid state heat pump comprises a capacitor and a power supply as a voltage source, wherein the capacitor comprises a first conductive layer, a layer of dielectric material disposed over the first conductive layer, and a second conductive layer over the layer of dielectric material;
applying a voltage from the power supply to the capacitor whereby heat is absorbed by the capacitor from the heat source; and
altering the voltage whereby heat is released by the capacitor to the heat sink;
wherein the dielectric material is a tetrahedral structure of amorphous silica which undergoes bond distortion under application of the voltage, to move the structure from a normal fourfold Si—O bonding coordination in a primary energy state to a stretched threefold coordination in the secondary energy state; and which returns to the normal fourfold bonding coordination when the voltage is altered.

13. The method of claim 12, wherein the dielectric layer is not sensitive to time dependent dielectric breakdown.

14. The method of claim 12, wherein the dielectric layer is formed of polar crystalline dielectric material so as to minimize the time-dependent dielectric breakdown.

15. The method of claim 12, wherein the dielectric layer is formed of cristobalite.

16. The method of claim 12, wherein the altering the voltage is accomplished by at least one of reducing, removing, and reversing the polarity of the voltage.

17. The method of claim 6, wherein the steps of applying the electric field and altering the electric field are repeated, isolating the dielectric material from the heat source during the altering step and isolating the dielectric material from the heat sink during the applying step.

18. The method of claim 6, wherein the dielectric material is a tetrahedral structure of amorphous silica which undergoes bond distortion under application of the electric field, to move the structure from a normal fourfold Si—O bonding coordination in the primary energy state to a stretched threefold coordination in the secondary energy state.

19. The method of claim 18, wherein the dielectric material comprises cristobalite.

20. The method of claim 6, wherein molecules of the dielectric material absorb about 1 eV of activation energy when they flip from the primary enrgy state to the secondary energy state; and release about 2 eV of energy when they return to the primary energy state.

* * * * *

UNITED STATES PATENT AND TRADEMARK OFFICE
CERTIFICATE OF CORRECTION

PATENT NO. : 7,628,021 B2 Page 1 of 1
APPLICATION NO. : 11/450400
DATED : December 8, 2009
INVENTOR(S) : Joe Wayne McPherson It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 581 days.

Signed and Sealed this

Second Day of November, 2010

David J. Kappos
*Director of the United States Patent and Trademark Office*